United States Patent
Frantz et al.

[19]

[11] Patent Number: 5,980,309
[45] Date of Patent: Nov. 9, 1999

[54] BATTERY CONNECTOR

[75] Inventors: Robert Houston Frantz, Newville; Andrew Dewitt Balthaser, Dauphin; John Thomas Larkin, Jr., New Cumberland, all of Pa.

[73] Assignee: The Whitaker Corporation, Wilmington, Del.

[21] Appl. No.: 08/927,981

[22] Filed: Sep. 11, 1997

Related U.S. Application Data

[60] Provisional application No. 60/030,154, Oct. 31, 1996.

[51] Int. Cl.[6] .................................................. H01R 3/00
[52] U.S. Cl. ........................................... 439/500; 439/627
[58] Field of Search .................................. 439/500, 625, 439/627, 754, 756, 759, 775

[56] References Cited

U.S. PATENT DOCUMENTS

| | | |
|---|---|---|
| 2,731,586 | 4/1956 | Born . |
| 3,181,974 | 5/1965 | Barbera ..................................... 439/500 |
| 3,629,793 | 12/1971 | Ettischer et al. . |
| 3,813,637 | 5/1974 | Grebik et al. . |
| 4,487,820 | 12/1984 | Engelstein et al. . |
| 4,623,203 | 11/1986 | Ritter . |
| 4,718,742 | 1/1988 | Utoh et al. . |
| 4,842,966 | 6/1989 | Omori et al. . |
| 5,024,605 | 6/1991 | Kasatani et al. . |
| 5,055,704 | 10/1991 | Link et al. . |
| 5,188,912 | 2/1993 | Katoh et al. . |
| 5,211,579 | 5/1993 | Seong et al. . |
| 5,240,792 | 8/1993 | Kawabata et al. . |
| 5,504,658 | 4/1996 | Matsuda et al. . |
| 5,586,907 | 12/1996 | Frantz et al. . |

FOREIGN PATENT DOCUMENTS

| | | |
|---|---|---|
| 59-103275 | 6/1984 | Japan . |
| 4-237945 | 8/1992 | Japan . |
| 2 292 635 | 2/1996 | United Kingdom . |

OTHER PUBLICATIONS

Data Sheet; Battery Holder HU2032–1; Renata Batteries, CH–4452 Itingen Switzerland; Drawn: 19.4.94; Checked: 23.6.94 Jun. 1994.

PCT International Search Report, (No Date).

*Primary Examiner*—Lincoln Donovan
*Attorney, Agent, or Firm*—Bradley N. Ditty

[57] ABSTRACT

A connector 20 for disk-shaped batteries 102 includes a housing 22 with a battery receiving cavity 38, first and second pairs of side walls 30, 34 and first and second terminal-receiving slots 40, 54 for receiving respective terminals 66, 84 therein and located between the side walls of the first and second pairs respectively. Each side wall 30, 34 includes an inwardly directed retention flange 32, 36 respectively for securing the battery 102 in the housing 22. The base 24 includes a plurality of board standoffs 62 of sufficient length to permit portions of the connector base 24 to be flexed downwardly toward a circuit board 108 a sufficient distance to move the retention flange 36 of one of the side walls 34 outwardly thereby releasing the battery 102 from said connector 20.

5 Claims, 5 Drawing Sheets

BATTERY CONNECTOR

This application claims the benefit of U.S. Provisional application(s) Ser. No(s). 60/030,154, filed Oct. 31, 1996.

FIELD OF THE INVENTION

This invention is related to connectors for batteries and more particularly to connectors for a disk-shaped cell or battery

BACKGROUND OF THE INVENTION

Disk-shaped cells or batteries are often used as back up protection for electronic equipment should there be a failure in the conventional power system. Typically these disk-shaped back-up cells are relatively small, having for example, a diameter of about 0.268 inches and a thickness of about 0.083 inches and are often referred to as "button batteries." The cell has a positive electrode extending along a major surface and the edge and a negative electrode extending over the other major surface and isolated from the positive electrode. For purposes of this invention, the term "battery" is to be understood to include a single cell. The battery is inserted into a connector housing mounted to a circuit board, the connector hereinafter being referred to as a "battery connector". It is desirable that a back up battery connector require a minimum amount of space on a circuit board within the equipment, be easy to mount to the circuit board, be readily accessible for replacing a depleted battery and be cost effective to manufacture. Furthermore, it is sometimes desirable to provide a back-up battery connector that is oriented horizontally on the circuit board to which it is mounted.

In prior art horizontally oriented battery connectors, the battery is placed in an "open" pocket or housing, that is, the housing base includes contacts that extend through the housing base and the battery is disposed above or between the contacts. Under certain conditions, such as during shipping of circuit boards or equipment having such batteries, the batteries may "pop out" of place thus rendering the back-up capability inoperable. The addition of a separate cover alleviates the problem of inadvertent removal of the battery but this adds to the cost of manufacturing and assembling the equipment. It is desirable, therefore, to have a connector having a one piece housing that securely holds the battery in place in a horizontal orientation, and furthermore, is cost effective to manufacture.

SUMMARY OF THE INVENTION

The present invention is directed to an electrical connector for a disk-shaped cell or battery. The connector includes a dielectric housing having a battery receiving cavity, two terminal-receiving slots extending through the base of the housing and into the cavity, and a positive terminal and a negative terminal disposed therein. The housing base includes first and second pairs of side walls extending upwardly at spaced locations therearound. The first and second terminal-receiving slots are positioned between the respective pairs of side walls. Each of the side walls of the two pairs includes an inwardly directed retention flange extending parallel to and spaced above the base and dimensioned to engage and extend over a respective portion of an upper surface of the battery to secure the battery in the housing. The base of the housing further includes a plurality of circuit board standoffs extending from a lower major surface. The standoffs are of sufficient length to permit portions of the connector base to be flexed downwardly toward a circuit board a sufficient distance to move the retention flange of at least one of the side walls outwardly thereby releasing the battery from the holder.

The invention is further directed to a retention feature for the positive terminal that includes a post extending upwardly within a terminal-receiving slot dimensioned to be received within an aperture of the positive terminal. The post includes an enlarged portion along a side of the post facing away from the battery cavity such that the width of the base of the post is greater than the diameter of the aperture of the positive terminal. When the positive terminal is located on the post, the edge of the aperture skives some of the plastic from the rearward side of the post thus ensuring that the aperture of the terminal is completely filled by the post. The side of the post facing the battery receiving cavity furthermore serves as a reference datum for assuring that the positive terminal is precisely positioned in the connector housing such that outwardly extending contact arms engage the outer edge of the battery and apply sufficient spring force to assure that the battery is in its proper position.

In an alternative embodiment of the invention, the post of the housing is rectangular and the terminal body includes a rectangular aperture having a terminal positioning barb extending into the aperture that forces the terminal against the rear edge of the aperture to accurately position the terminal in the connector.

It is an object of the present invention to provide a battery holder that securely retains a disk-shaped battery in a horizontal orientation.

It is a further object of the invention to provide a top-loaded horizontally oriented battery connector that permits easy removal of the battery from the connector when desired.

Embodiments of the invention will now be described by way of example with reference to the accompanying drawings.

DETAILED DESCRIPTION OF EMBODIMENTS OF THE INVENTION

Figure 1:
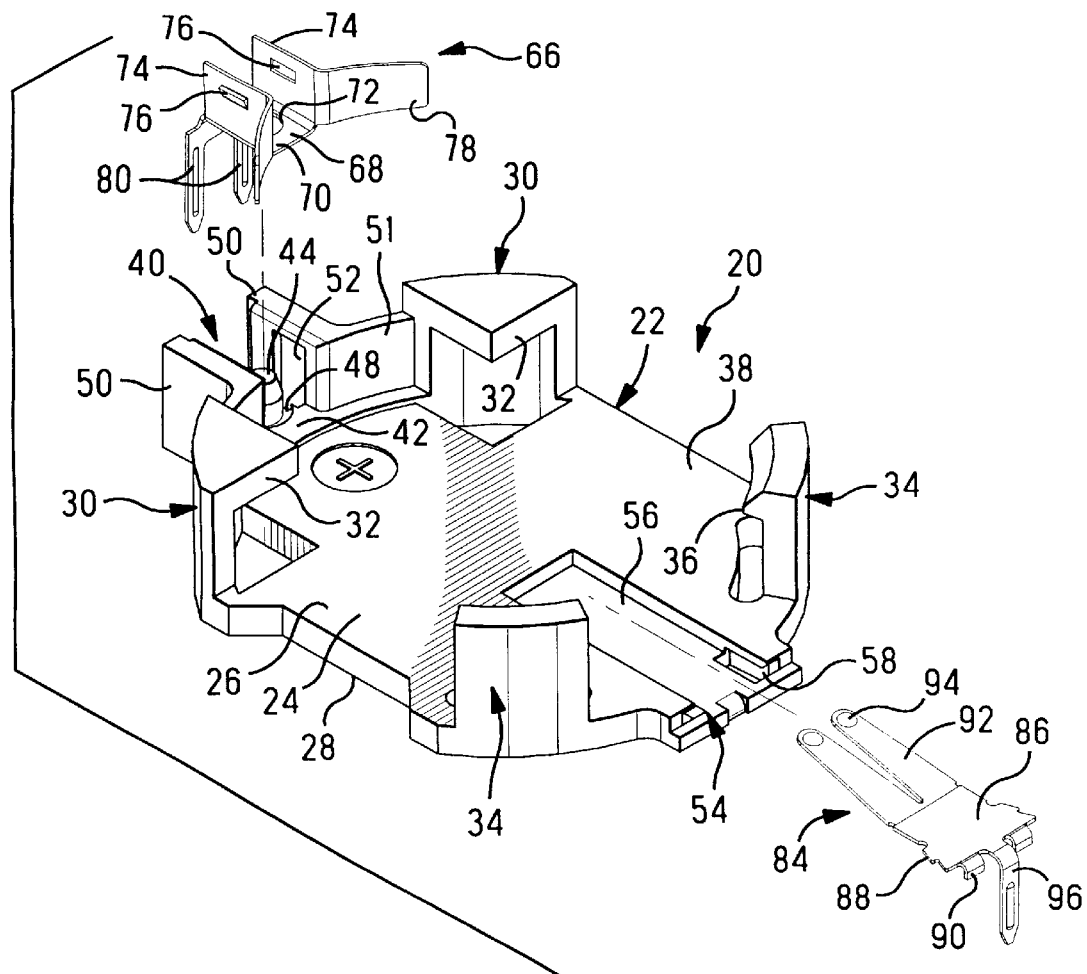
FIG. 1 is an isometric view of a battery connector of the present invention with the terminals exploded therefrom.
Figure 6:
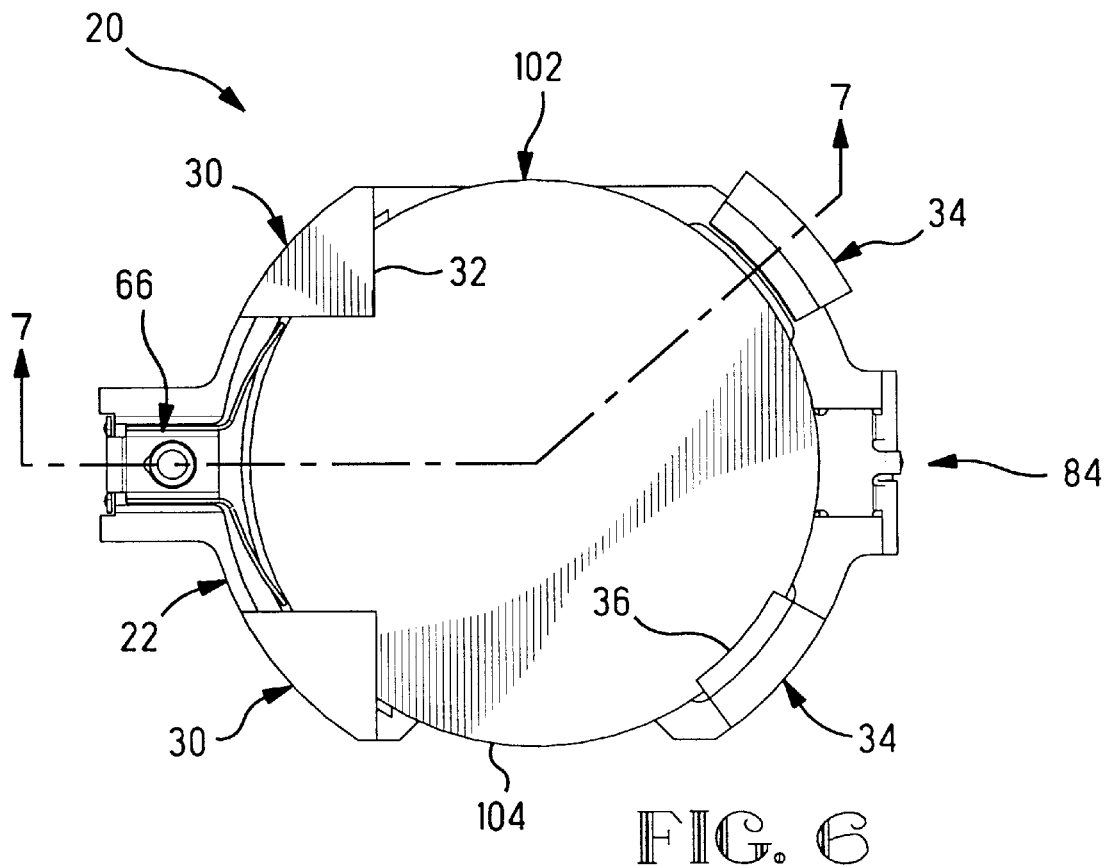
FIG. 6 is a top plan view of the assembled connector of FIG. 2 with a battery disposed therein and illustrating how the battery is removed from the connector.
Figure 7:
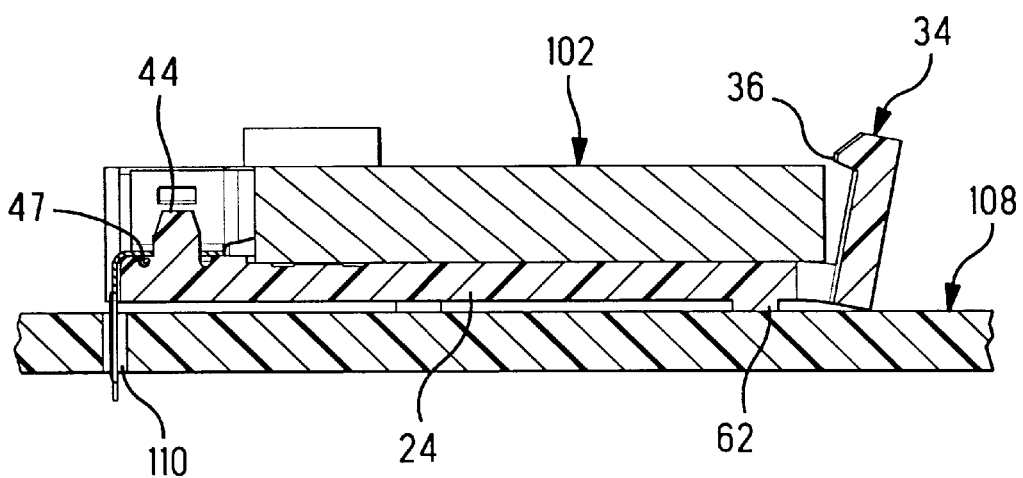
FIG. 7 is a sectional view taken along line 7—7 of FIG. 6.

Referring now to FIGS. 1 through 5, the horizontally oriented battery connector 20 of the present invention includes a dielectric housing 22, having first and second terminals 66, 84 disposed therein. Housing 22 includes a base 24 having opposed sides 26, 28, which as seen in FIG. 1, each of which covers a major portion of the base 24. First and second pairs of side walls 30, 34 extend upwardly from the first major surface 26, the side walls 30, 34 being at spaced locations around the base 24 defining a battery receiving cavity 38 dimensioned to receive a disk-shaped battery therein. Each side wall 30, 34 includes an inwardly directed retention flange 32, 36 respectively that extend parallel to and are spaced above the base 24. The flanges 32, 36 are dimensioned to engage and extend over a respective portion of an upper surface of the battery 102 to secure the battery 102 in the housing 22, in a manner as seen in FIG. 6. Base 24, shown in FIGS. 1 and 2, includes first and second terminal-receiving slots 40, 54 for receiving respective first and second terminals 66, 84 between the side walls 30, 34 of the first and second pairs respectively of side walls. Base 24, best seen in FIGS. 5 and 7, includes a plurality of board standoffs 62 extending from the lower major surface 28. As best seen in FIG. 7, standoffs 62 are of sufficient length to permit portions of the connector base 24 to be flexed downwardly toward a circuit board 108 a sufficient distance to move the retention flange 36 of at least one of the side walls 34 outwardly thus releasing the battery 102 from the battery receiving cavity 38.

Figure 8:
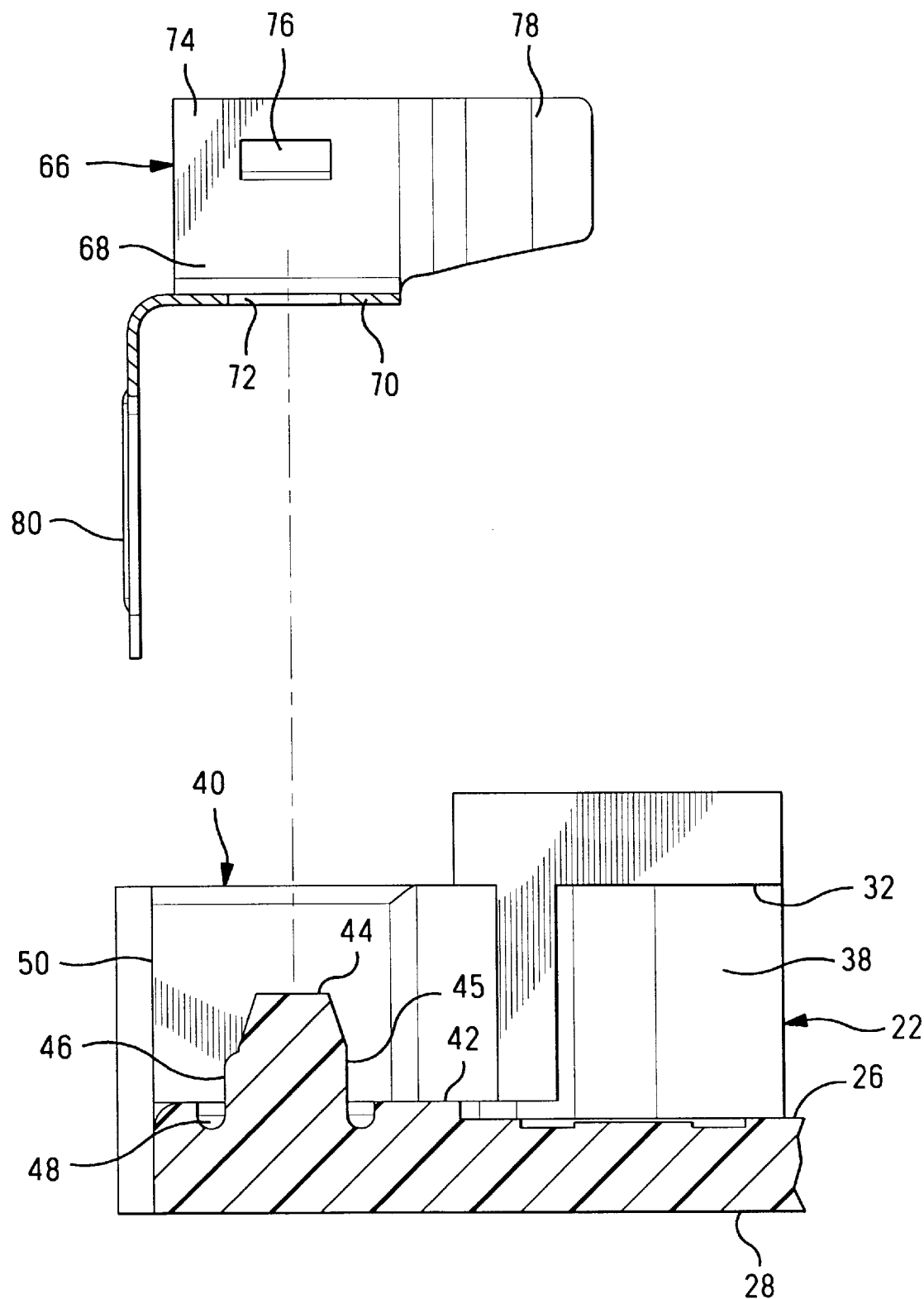
FIG. 8 is an exploded view of a fragmentary portion of the connector of FIG. 5.

The first terminal-receiving slot 40, as best seen in FIG. 1, includes a base portion 42 having post 44 extending upwardly therefrom. As best seen in FIG. 8, post 44 has a cavity facing surface 45 and an enlarged portion 46 extending outwardly from the base of post 44 away from the cavity 38. A recess 48 extends into the base 42 and surrounds at least the rearward portion 46 of post 44. Post 44 cooperates with surfaces of first terminal 66 to secure the terminal 66 in the battery connector 20, as more fully described below. As best seen in FIG. 1, first terminal receiving slot 40 further includes side supports 50 extending upwardly therefrom having cavity directed portions 51 that extend to the first pair of side walls 30. Side supports 50 include recesses 52 therein dimensioned to cooperate with the first terminal 66 when it is disposed in the first terminal slot 40. The second terminal receiving slot 54 includes a recessed portion 56 extending into the top major surface 26 of base 24. Portion 56 further including slots 58 dimensioned to receive retention barbs of the second terminal 84 therein as more fully explained below.

Figure 4:
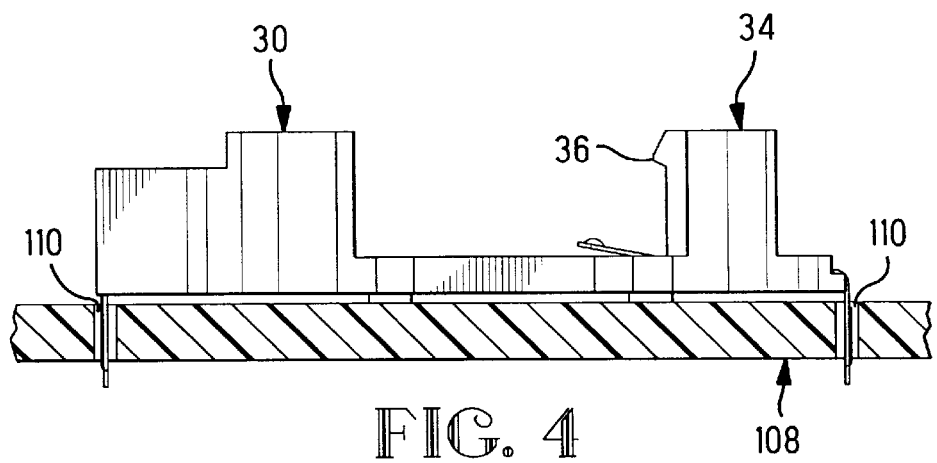
FIG. 4 is a side view of the assembled connector mounted to a circuit board.
Figure 5:
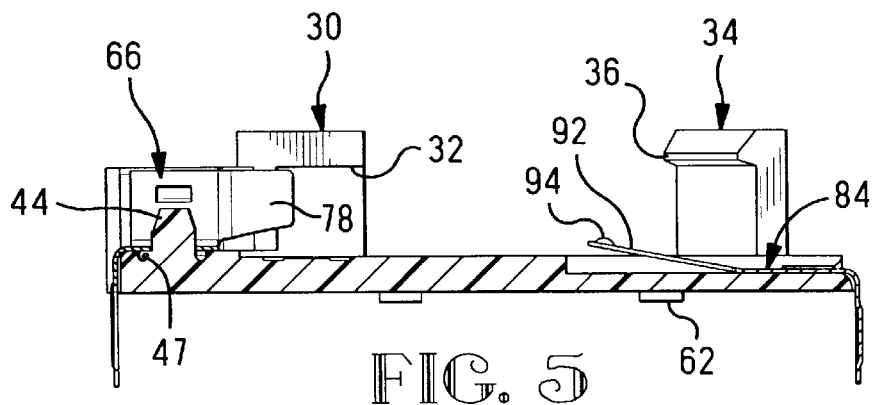
FIG. 5 is a cross-sectional view of the assembled connector of FIG. 2 illustrating the positions of the positive and negative terminals in the connector housing

First terminal 66 includes a body 68 having a base 70 and a pair of upwardly standing side walls 74. Body 68 of terminal 66 includes an aperture 72 extending therethrough having a diameter that is dimensioned to receive the leading end of post 44 but to be smaller than the width of the base of post 44, thus accommodating for minor variations in the diameter of aperture 72. Each side wall 74 includes a spring arm 78 extending into the cavity 38, the spring arms being curved and dimensioned to engage an electrode along the edge of a disk-shaped battery, the spring arms 78 together defining an essentially U-shaped contact surface. Each wall 74 further includes a retention protrusion 76 extending outwardly therefrom for engaging recess 52 in side support 50. The body 68 includes a second connecting section dimensioned to be received in through-holes 110 of circuit board 108, as shown, for example, in FIG. 4. In the preferred embodiment, first terminal 66 of FIG. 1 includes two legs 80 for being received in respective through-holes 110 of circuit board 108 as best seen in FIG. 4.

Figure 2:
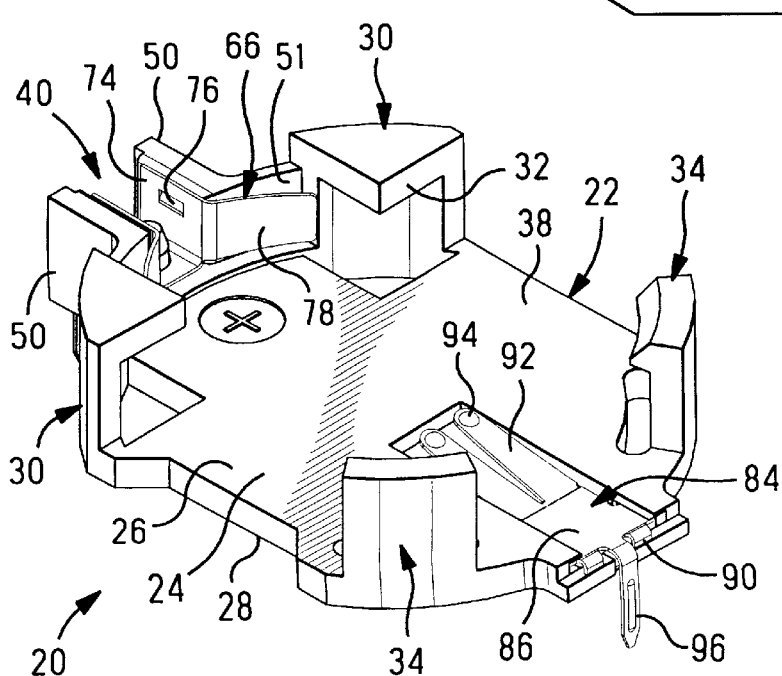
FIG. 2 is an isometric view of the assembled battery connector of FIG. 1.
Figure 3:
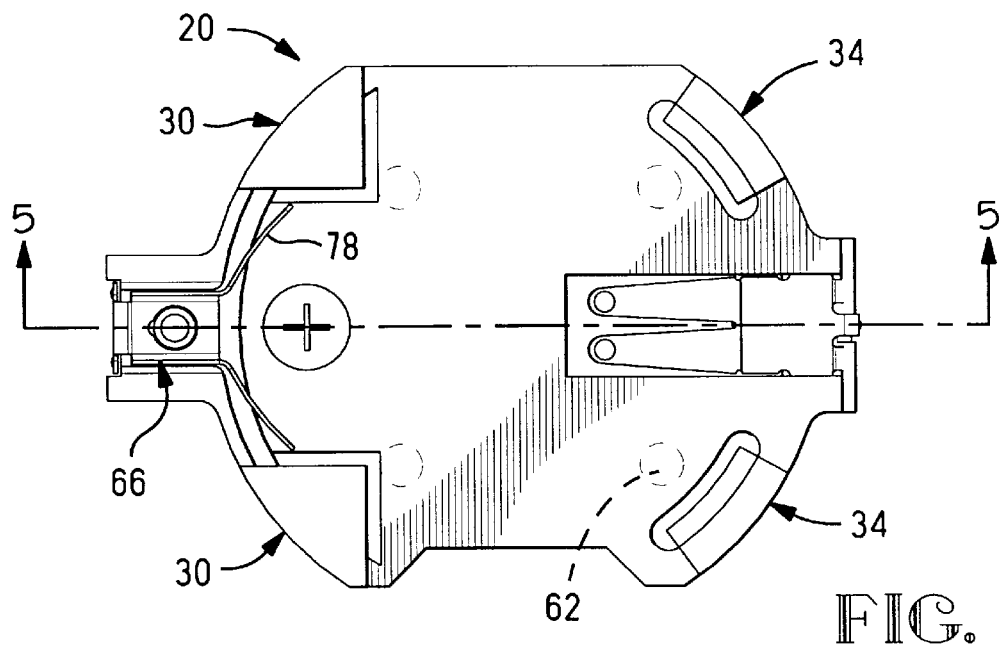
FIG. 3 is a top plan view of the assembled connector of FIG. 2 with the standoffs shown in phantom.

Second terminal 84 of FIG. 1 includes a body 86 having retention barbs 88 extending outwardly from opposite side edges thereof and first and second connecting sections 92, 96 extending outwardly from opposite end edges thereof. The first connecting section 92 includes a pair of cantilevered beams having contact surfaces 94 at the leading ends thereof. The second connecting section 96 is adapted to be received in a through-hole 110 of a circuit board 108. In the preferred embodiment, body 84 further includes tabs 90 that extend from the body edge proximate the second connecting section 96 and are curved downwardly for engaging the outer edges of the terminal receiving slot 54, as seen in FIG. 2. The contact sections 94 are adapted to engage the negative electrode 106 of the battery 102 (not shown). More particularly, as can be envisioned from FIG. 2, the contact sections 94 extending upward from the major surface 26 engage the negative electrode 106 when the battery 102 is placed in the battery connector 20 and onto the major surface 26.

The first terminal 66 is assembled to the connector housing 22 by inserting post 44 into aperture 72 in the base of the terminal 66. Aperture 72 is disposed over the leading end of post 44 and as terminal 66 is moved down onto the post 44, and in so doing, the rearward edge of aperture 72 skives the dielectric material from the rib 46 (see FIG. 8), thereby filling aperture 72 with plastic and firmly securing first terminal 66 in the battery connector 20. The material skived from rib 46 is forced into the recess 48 as the first terminal 66 is secured into its final position. The rib 46 accommodates variations in the diameter of aperture 72 thus compensating for manufacturing tolerances. The retention tabs 76 are received and engaged by the recesses 52 in the side walls 50 of the first terminal-receiving slot 40. The cavity edge 45 of post 44 is used as a reference datum to assure that the first terminal 66 is properly positioned in the cavity 38. As seen with reference to FIG. 2, spring arms 78 are formed at an angle to provide sufficient spring force to assure that the battery 102 is held securely against inner surfaces of the first pair of side walls 30. The second terminal 84 is disposed in the recess 56 with the barbs 88 extending into the slots 58, tabs 90 extending over the edge of the second terminal receiving slot 54, and the second connecting section 96 extending downwardly therefrom.

Referring now to FIGS. 6 and 7, battery 102 is held securely in cavity 38 of connector housing 22 by means of the retention flanges 32, 36, which extend over portions of the top surface of battery 102. The battery 102 can be removed from the housing 22 by flexing at least one of the pair of side walls 34 outwardly to remove the flange 36 from the top surface of the battery 102 whereby the battery can be gripped and removed from the housing 22. The standoffs 62 space connector 20 a selected distance above circuit board 108 and provide room for side wall 34 to be deflected downwardly toward a circuit board 108 a sufficient distance such that the flange 36 is no longer engaged on the upper surface of the battery 102, as best seen in FIG. 7.

The first and second terminals 66, 84 can be stamped from a continuous metal strip and handled while attached to a carrier strip, thus facilitating subsequent plating and automatic assembly operations. Suitable materials for the terminals of the present invention include copper alloys such as phosphor bronze and the like. The board connecting portions of the terminals may be solder tails or may be legs that have compliant sections.

The housing 22 of the present invention is molded from a high temperature thermoplastic suitable for withstanding temperatures associated with soldering connectors to circuit boards, as known in the art. The housings 22 are molded in conventional molds.

Figure 9:
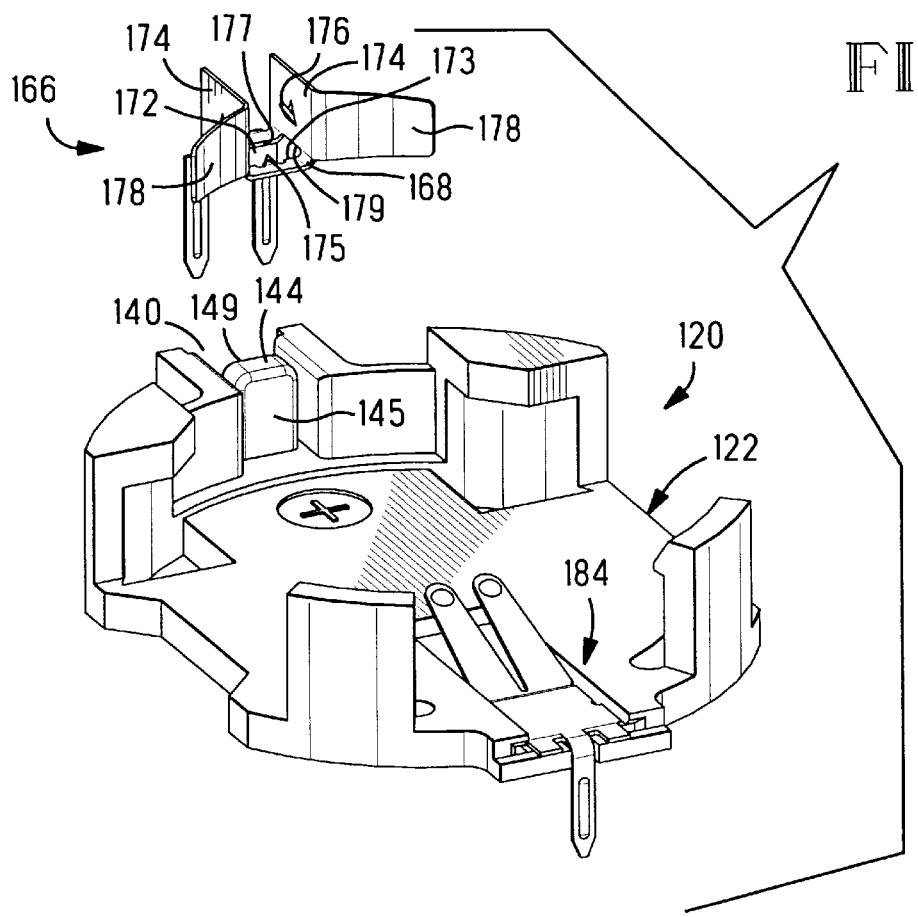
FIG. 9 is an isometric view of an alternative embodiment of the battery connector of the invention with a terminal exploded therefrom.
Figure 10:
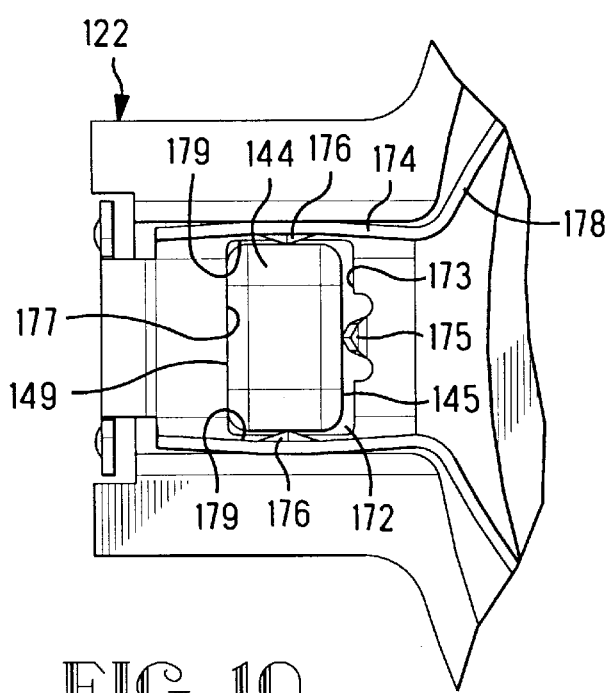
FIG. 10 is a fragmentary top plan view of the assembled connector of FIG. 9.

FIGS. 9 and 10 disclose an alternative embodiment 120 of the invention in which the first terminal slot 140 of housing 122 includes a rectangular post 144 having forward and rearward surfaces 145, 149. The body 168 of first terminal 166 includes a rectangular aperture 172 having opposed front and rear edges 173, 177 and opposed sides 179. Front edge 173 includes at least one terminal positioning barb 175 extending into the aperture 172 that forces the rear edge 177 of the aperture 172 of the first terminal 166 against rear surface 149 of post 144 to accurately position the first terminal 166 in the connector 120. The side walls 174 of first terminal 166 further include retention barbs 176 that extend into the post receiving area and skive the post 144 as the first terminal 166 is moved into the terminal receiving slot 140 to hold first terminal 166 securely in position and the solder tails thereof in true position. Additionally the barbs 176 force the side walls of first terminal 166 against the side walls of slot 140, to assure the terminal side walls 174 are held substantially perpendicular in slot 140, as seen in FIG. 9, and the spring arms 178 of terminal 166 in position to engage a battery in a manner similar to that described for spring arm 78 of FIG. 2.

The present invention provides a battery connector for disk-shaped batteries that may be mounted to a board in a horizontal orientation and is cost effective to manufacture. The battery terminals, furthermore, cooperate with structure in the housing and are held securely in position without the need for additional manufacturing steps, such as, for example, staking or the like. The battery connector of the present invention, furthermore, provides a back up battery that requires a minimum amount of space between parallel circuit boards.

It is thought that the battery connector of the present invention and many of its attendant advantages will be understood from the foregoing description. It is apparent that various changes may be made in the form, construction, and arrangement of parts thereof without departing from the spirit or scope of the invention, or sacrificing all of its material advantages.

We claim:

1. A battery connector for disk-shaped batteries each having positive and negative electrodes, said battery connector comprising:

a dielectric housing having a base having upper and lower surfaces each having a major surface thereon respectively that includes the majority of the surface of the base thereof and respectively serve as first and second major surfaces, said base further having first and second pairs of side walls extending upwardly from said first major surface of said base, said side walls being spaced apart from each other at locations around said base and dimensioned to receive a disk battery therebetween, said spaced apart side walls being arranged into first and second pairs, and first and second terminal-receiving slots for receiving respective terminals therein and located between the side walls of said first and second pairs respectively;

a first terminal disposed in said first terminal-receiving slot between said side walls of said first pair, said first terminal engaging a positive electrode of said battery when said battery is inserted in said battery connector and defining a positive terminal therefor;

a second terminal disposed in said second terminal-receiving slot between said side walls of said second pair, said second terminal including a pair of spring arms dimensioned to engage a negative electrode on a surface of said battery when said battery is inserted in said battery connector and defining a negative terminal therefor;

each of said side walls including inwardly directed retention flanges parallel to and spaced above said first major surface and dimensioned to engage said battery when said battery is inserted in said battery connector and extend over a respective portion of an upper surface of said battery to secure said battery in said housing; and said base including a plurality of board standoffs extending upward from said second major surface, said standoffs extending upward so as to permit portions of said base to be flexed downwardly by arising the retention flanges of one of said pairs of side walls outwardly thereby allowing the release of said battery from said battery connector.

2. The battery connector of claim 1, wherein said first terminal includes a pair of spring arms surrounding an edge portion of said battery.

3. The battery connector of claim 1, wherein said first terminal includes a body having an aperture with a diameter extending therethrough and said first terminal-receiving slot includes a terminal locating post having a leading end dimensioned to be received in said aperture and a base that has a width greater than the diameter of said aperture, whereby upon positioning said first terminal over said post, said aperture skives material from said base of said post thus assuring said first terminal is securely held to said post.

4. The battery connector of claim 1, wherein said first terminal includes a body having a rectangular aperture extending therethrough and at least one positioning barb extending into said rectangular aperture along a front edge thereof, and said first terminal-receiving slot includes a rectangular terminal locating post dimensioned to be received in said rectangular aperture, whereby when said first terminal is moved onto said post, said at least one positioning barb positions a rear edge of the rectangular aperture of said first terminal against a rear wall of said post.

5. The battery connector of claim 4, wherein side walls of said first terminal include retention barbs extending into a post receiving area of said first terminal and skive side walls of said post as the first terminal is moved onto the post.

* * * * *